United States Patent [19]

Van der Mast

[11] Patent Number: 5,300,775
[45] Date of Patent: Apr. 5, 1994

[54] METHOD OF SELECTING A SPATIAL ENERGY SPREAD WITHIN AN ELECTRON BEAM, AND AN ELECTRON BEAM APPARATUS SUITABLE FOR CARRYING OUT SUCH A METHOD

[75] Inventor: Karel D. Van der Mast, Eindhoven, Netherlands

[73] Assignee: U.S. Philips Corporation, New York, N.Y.

[21] Appl. No.: 15,694

[22] Filed: Feb. 9, 1993

[30] Foreign Application Priority Data

Feb. 12, 1992 [EP] European Pat. Off. ........ 92200384.3

[51] Int. Cl.$^5$ ............................................. H01J 49/44
[52] U.S. Cl. ................................. 250/305; 250/307; 250/311
[58] Field of Search ................... 250/305, 307, 311

[56] References Cited

U.S. PATENT DOCUMENTS

| | | | |
|---|---|---|---|
| 3,979,590 | 9/1976 | Andersen | 250/305 |
| 4,851,670 | 7/1989 | Krivanek | 250/305 |
| 4,942,298 | 7/1990 | Comer | 250/305 |

FOREIGN PATENT DOCUMENTS 63-231852  9/1988  Japan .

*Primary Examiner*—Jack I. Berman
*Attorney, Agent, or Firm*—Leroy Eason

[57] ABSTRACT

A method and apparatus for selecting the spatial energy spread of an electron beam for producing an image of an object, as in an electron microscope. An energy-dispersive member is arranged in the vicinity of the electron beam source to widen the electron beam in a dispersion direction. Selection of an energy dispersion within the beam is achieved by selecting a number of pixels having such a local energy dispersion in the image plane of the object.

18 Claims, 2 Drawing Sheets

METHOD OF SELECTING A SPATIAL ENERGY SPREAD WITHIN AN ELECTRON BEAM, AND AN ELECTRON BEAM APPARATUS SUITABLE FOR CARRYING OUT SUCH A METHOD

BACKGROUND OF THE INVENTION

1. Field of the Invention

The invention relates to a method of reducing a spatial energy spread within an electron beam, the electron beam being widened by means of an energy-dispersive member.

The invention also relates to an electron beam apparatus suitable for using such a method.

2. Description of the Related Art

An electron beam apparatus of this kind is known from the abstract in English of JP-A 63-231852. Energy spread occurs within a beam from an electron source due to initial energy spread of the emitted electrons and energy spread due to statistic interactions of electrons in the beam (Boersch effect). An electron beam apparatus described therein comprises, subsequent to the condensor lens, an energy-dispersive member, notably a Wien filter, in combination with a slit, extending transversely of the dispersion direction of the dispersive member, in order to reduce the energy spread of the electron beam.

The operation of the filter is based on a predetermined relation between the strength of the electric field E, the strength of the magnetic field B and the acceleration potential of the electrons. In a Wien filter the electric field and the magnetic field cross one another at right angles and both fields are directed perpendicularly to the direction of propagation of the electrons. The acceleration potential required to ensure that electrons having a given velocity v are not deflected follows from the above relation. Electrons incident on the filter with an energy which deviates from the energy of the electrons of the velocity v are distributed over a spectrum. The slit subsequent to the filter transmits exclusively the non-deflected electrons, thus reducing the energy spread of the electron beam.

It is a drawback that due to the use of a slit a comparatively large part of the beam current is intercepted, i.e. only the electrons situated within the desired energy window are transmitted. Moreover, providing a slit in a high voltage environment is very critical and hence comparatively intricate and expensive.

It is an object of the invention to provide a method and an electron beam apparatus in which substantially the entire beam current can be used and in which said drawback is mitigated.

According to a first aspect of the invention, the method is characterized in that the energy-dispersive member is arranged in the vicinity of an electron source generating the electron beam, the electron beam being widened by said member in a dispersion direction with a dispersivity which is greater than the diameter of the electron source, a number of pixels of local energy spread being selected in an image plane of an object.

Local energy spread is to be understood to mean the energy spread of the incident beam, measured at an infinitely small point of the object.

Because all electrons within an electron beam do not have the same energy, due to initial energy spread of the emitted electrons and energy spread due to statistic interactions of the electrons in the beam, the beam will be widened in a dispersion direction after passing the dispersive member. As a result, the local energy spread of the electron beam, being the energy spread of the electrons per pixel, will be reduced relative to the original energy spread. The reduction may be substantial when the ratio of the dispersion to the source diameter is sufficiently great.

Due to the energy dispersion, the mean local energy measured across the object changes in the dispersion direction. The ultimate energy selection is realised by implicit selection of a number of pixels in the image of the object. This means that electrons of different pixels are separately detected in the imaging mode, so that a slit in the electron beam path can be dispensed with. The local energy spread is thus substantially reduced.

A version of the method in accordance with the invention is characterized in that the selection of the number of pixels is performed by tilting the object.

Because the mean energy of the widened electron beam incident on the object varies in the dispersion direction, defocusing will occur across the object in that direction in the TEM as well as in STEM images. A fully focused line can be obtained by tilting the object. Usually, however, such defocusing will be within the depth of focus so that it can be ignored.

A version of the method in accordance with the invention in which transmission analysis of the object takes place is characterized in that an image processing procedure is applied in which the energy spread is used as a parameter.

When the transmission electron microscopy utilizes an image processing procedure for image reconstruction, the energy spread of the beam and the variation of the energy across the object can be taken into account in the transfer function used.

Another version of the method in accordance with the invention in which transmission analysis of the object takes place is characterized in that an image part of specific local energy spread is selected by means of a selective member arranged in an image plane of the object.

Thus, in the image plane of the object a part of the image is selected by means of a selective member arranged in the image plane. This member may be a slit or other diaphragm, for example a so-called "Selected Area" diaphragm. This selection can also be performed by means of the detector itself, for example by means of a CCD detector arranged in the desired position in the image plane. Another possibility in this respect is the use of the entrance diaphragm of an imaging electron-energy-loss spectrometer. The advantage over the state of the art resides in the fact that selection does not take place at the high-voltage level, but only in the image plane of the object. As a result, inter alia the full beam current can be used to irradiate the object.

In accordance with a second aspect of the invention, the method is characterized in that the member is arranged in the vicinity of an electron source generating the electron beam, the object being step-wise scanned by the widened electron beam in a direction in which the object is focused and which extends substantially perpendicularly to the dispersion direction, the magnitude of the steps being determined by a desired resolution.

Widening of an electron beam on the basis of energy dispersion is particularly attractive. When the spot of the electron beam is widened, a larger part of the object can be irradiated per scanning measurement. The desired resolution can be achieved as a function of the magnitude of the steps in the direction perpendicular to the dispersion direction. An electron beam apparatus in accordance with the invention which is suitable to execute a method as claimed comprises an electron source, an electron-optical system, a specimen holder and an energy-dispersive member.

A further embodiment of the electron beam apparatus in accordance with the invention is characterized in that the electron beam apparatus comprises an object tilting system.

A further embodiment of the electron beam apparatus in accordance with the invention is characterized in that the electron beam apparatus comprises an image processing system.

A further embodiment of the electron beam apparatus in accordance with the invention is characterized in that the electron beam apparatus comprises a diaphragm which is arranged in an imaging plane of the object.

Another embodiment of an electron beam apparatus in accordance with the invention is suitable to carry out a method as claimed and comprises an electron source, an electron-optical system, a specimen holder, an energy-dispersive member and a scanning unit.

A further embodiment of the electron beam apparatus in accordance with the invention is characterized in that the electron beam apparatus comprises an imaging analysis system, it being possible to measure a spectrum in a direction extending substantially perpendicularly to a direction in which the object can be focused.

Thus, in the dispersion direction spectral information is produced per pixel situated within the widened spot, whereas similar information can be obtained for other pixels in the scanning direction, substantially perpendicular to the dispersion direction, when the widened spot is shifted. Thus, the spectral information is measured line-wise per image. Because an object part to be analysed is irradiated only by a part of the electron beam of local energy spread during such an analysis, a resolution can be achieved which is substantially higher than when irradiation takes place by means of an electron beam without energy-dispersion.

A further embodiment of the electron beam apparatus in accordance with the invention is characterized in that the electron beam apparatus comprises a correction member which includes a multi-pole element for correction of chromatic aberration.

The resolution in the length direction of the spot of the electron beam is determined by the electron probe. The resolution in the width direction of the spot of the electron beam, i.e. dispersion direction, is determined by the chromatic aberration of the objective lens.

In order to prevent the occurrence of electrons of deviating energy, due to the chromatic aberration, in an area of local energy spread, a correction element can be provided in the principal plane of the objective lens. This correction element preferably comprises a combined magnetic and electrostatic quadrupole for correction of the chromatic aberration in the dispersion direction.

A preferred embodiment of the electron beam apparatus in accordance with the invention is characterized in that the energy-dispervive member is arranged in a given position in a beam path between the electron source and a conjugate object plane, said position corresponding to an acceleration potential of less than 20 kV.

A conjugate object plane is to be understood to mean any plane equivalent to the object plane.

The dispersive member is preferably arranged in a position in which the acceleration potential is sufficiently low, so that the electrons have a comparatively low energy and can hence be comparatively readily influenced. Between the electron source and the energy-selective filter there may also be provided, if desired, a lens or other electron-optical elements.

A further embodiment of the electron beam apparatus in accordance with the invention is characterized in that the energy-dispersive member is a Wien filter.

Another feasible embodiment of the energy-dispersive member is formed by a Ω-filter or an electrostatic filter. Both filters are known per se.

A Wien filter offers the advantage that it is a "direct-vision" member so that practical problems such as in respect of alignment are minimized. A Wien filter is known in the art from inter alia British Patent Specification GB 1,364,930.

A further embodiment of the electron beam apparatus in accordance with the invention is characterized in that the electron source is a field emission source.

The intrinsic source diameter of a field emission source is much smaller than the source diameter of a conventional electron source. Consequently, for a comparable energy spread of a conventional source and a field emission source, after dispersion the spot produced by the field emission source will exhibit a substantially greater length-to-width ratio.

BRIEF DESCRIPTION OF THE DRAWINGS

The invention will be described in detail hereinafter with reference to the drawings, wherein.

DESCRIPTION OF THE PREFERRED EMBODIMENTS

Figure 1:
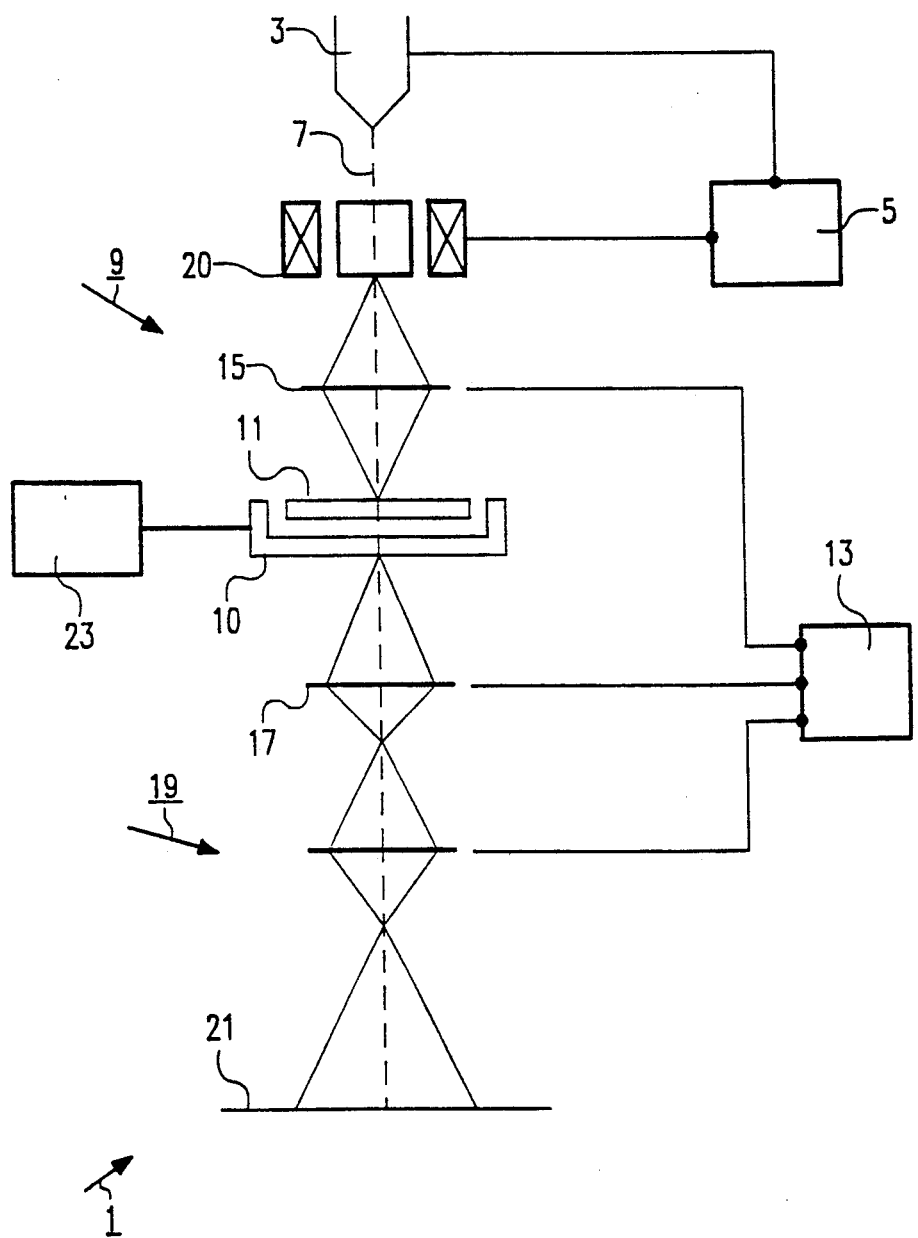
FIG. 1 shows diagrammatically an electron beam apparatus in accordance with the invention, provided with an energy-dispersive member.

The electron beam apparatus 1 which is diagrammatically shown in FIG. 1 comprises an electron source 3 which is controlled by a high voltage generator 5 so as to generate an electron beam 7, and also comprises an electron-optical system 9 for directing the beam 7 onto an object 11 arranged in a specimen holder 10. The electron-optical system 9 is composed of a condensor system and a first objective lens, only the objective lens 15 being shown in the Figure for the sake of simplicity. After passing the object 11, the electrons are imaged on an image plane 21 by means of a second objective lens 17 and a lens system 19 which comprises a diffraction lens, an intermediate lens and a projector system (not shown). The lenses are energized by a lens power supply system 13.

Due to initial energy spread of the emitted electrons and energy spread due to statistic interactions of the electrons in the beam (Boersch effect), an energy spread occurs within the spot of the electron beam 7 emitted by the electron source 3. This energy spread forms a restriction in respect of the resolution of an electron beam apparatus.

In the case of high-resolution electron microscopy, the information limit is restricted by the width of the chromatic envelope function. The lower the local energy spread within the electron beam, the wider this envelope function will be, so that the information limit becomes higher and hence the resolution becomes better.

In the case of electron-energy-loss spectroscopy, a higher energy resolution can be achieved by way of a smaller energy spread in the electron beam as will be described in detail hereinafter.

One method of reducing the energy spread of an electron beam is known from the above-cited abstract in English of JP-A 63-231852. Using an energy-dispersive member, notably a Wien filter, the electron beam is widened in a dispersion direction. The beam is subsequently incident on a slit provided transversely of said dispersion direction. Exclusively the part of the electron beam exhibiting the desired local energy spread is transmitted to the object via the slit. A drawback consists in that a substantial part of the intensity of the electron beam cannot reach the object.

In accordance with the invention, the energy spread within the electron beam can be reduced without utilizing a slit and hence without losing an amount of intensity. To this end, the electron beam is widened by an energy-dispersive member 20 in a dispersion direction in a plane perpendicular to the electron beam. The greater the ratio of the dispersion to the source diameter, the smaller the local energy spread within the electron beam will be in comparison with the original energy spread of the source. Subsequently, the object 11 is irradiated by the complete, widened electron beam. The ultimate selection of a given region is realised by implicit selection of a number of pixels of the object in the image plane 21, because electrons of different pixels are separately detected in the imaging mode. The advantage thereof resides in the fact that the selection takes place in the image plane and not at the high voltage level as is the case when use is made of a slit. The selection can be performed in various ways.

Because the mean energy within the widened spot locally deviates in the dispersion direction, the focus changes as a function of the location on the object in this direction. In order to obtain a fully focused line, the electron beam apparatus 1 comprises an object tilting system 23. The source can be focused over the entire length of the image over the entire irradiated region by tilting the object 11.

A second possibility for the selection of a number of pixels with a local energy spread consists in that, when the charged particle beam apparatus is a transmission electron microscope, the apparatus is provided with an image processing system (not shown) with an image processing procedure for image reconstruction.

Phase and amplitude information of an object can be formulated in the form of a wave function $\phi$ in a selected reference plane of the object.

For image reconstruction of the object, the wave function $\phi$ is subsequently back-propagated to the exit plane of the object. During this step the wave function $\phi$ is multiplied by the inverse transfer function of the microscope, followed by two-dimensional inverse Fourier transformation. The inverse transfer function implies the elimination of the phase shift due to spherical aberration and defocus. The projected atomic structure can be derived from the wave function thus obtained in the object plane. In the case of a thin object, this projected structure is represented by the phase of the wave function at the exit plane of the object. For a thicker crystalline object, irradiated along a zone axis, use is made of an algorithm based on a channelling theory. Channelling theory assumes channelling in the individual columns when an electron beam is incident on a crystal parallel to columns of atoms. The electrons are intercepted in these columns so that an unambiguous relationship exists between the type of column and the wave function at the exit plane of the crystal at the area of said column. The relationship is then independent of the composition of neighbouring columns. Knowledge of the wave function thus results in projected atomic structure information.

During the image reconstruction, the variation of the focus, in other words the variation of the energy across the object within the widened spot, can be included in the transfer function as a function of the dispersion.

The defocusing due to the energy spread, however, is very small as can be demonstrated on the basis of a numerical example.

A typical energy spread within an electron beam spot is in the order of 1 eV. When use is made of a dispersive member whereby the spot is increased approximately $50\times$ in the dispersion direction, a spot having a diameter of 100 Å is widened to 5000 Å. The local energy spread consequently, is $50\times$ smaller. In the case of an enlargement of, for example $5.10^5$, such a spot covers a specimen area of $10^{-2}$ mm. The variation of the focus across said speciment region is given by:

$$\Delta f = \frac{\Delta eV}{V} C_c$$

where $C_c$ is the chromatic aberration constant. A numerical example then produces:

$$\Delta f = \frac{1eV}{2 \cdot 10^5 eV} \cdot 2 \cdot 10^{-3} \text{ m} = 100 \text{ Å}$$

This means that a focus variation of 100 Å occurs over a distance of 5000 Å, which is very small so that this defocusing will usually be within the depth of focus and hence can be ignored.

When the electron beam apparatus is a transmission electron microscope, a selective member 27 can be arranged in the image plane 21 in order to select a part of the image of the object 11. This selective member 27 may be, for example the so-called Selected Area (SA) diaphragm. The diaphragm 27 intercepts a part of the total image intensity, but the advantage again resides in the fact that the slit is not provided at the high voltage level. This embodiment is particularly suitable for spectral analysis. Because of the comparatively small local energy spread of the electron beam in the selected part of the image, a resolution can be achieved which is considerably higher than when the radiation to be analysed originates from a part of the image irradiated by the electron beam which is complete in respect of spectrum.

When the electron beam apparatus is a scanning microscope in the imaging mode, a widened electron beam offers the advantage that when it is used in its entirety to irradiate an object, a substantially larger object part can be irradiated per measurement. The object is scanned in a direction transversely of the dispersion direction. When the beam is step-wise displaced across the object during scanning, a comparatively large part of the object will be scanned during a short period of time. The magnitude of the steps then codetermines the resolution. This embodiment can be very advantageously used for spectral analysis. Information concerning a comparatively large area can thus be obtained within a comparatively short period of time.

Figure 2:
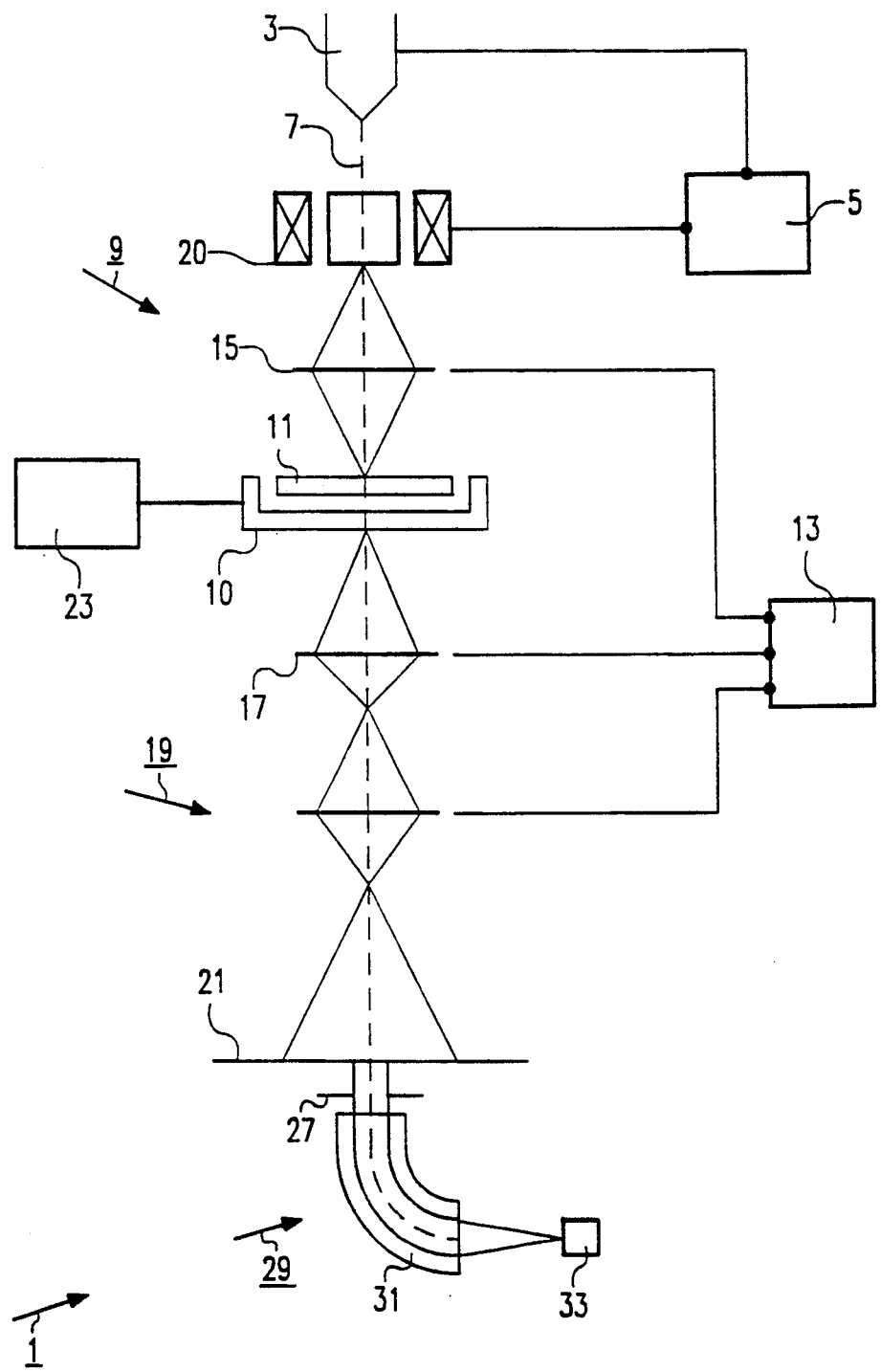
FIG. 2 shows diagrammatically an electron beam apparatus in accordance with the invention, provided with an electron-energy loss spectrometer

Such spectral analysis can also be used in electron energy loss spectroscopy (EELS) in the imaging mode. FIG. 2 shows a suitable embodiment of the electron beam apparatus in this respect. Corresponding components of the FIGS. 1 and 2 are denoted by corresponding reference numerals. The selective member 27 in the image plane 21 is now formed by the entrance diaphragm of the spectrometer 29 which also consists of an energy analyser 31 and a detector 33. According to this technique, reduction of the energy spread within the electron beam is used to achieve a considerable increase of the energy resolution by selection of a small part of the irradiated image field of the object. The resolution is determined by the ratio of the image field to the dispersion which should be small.

On the one hand, the zero-loss peak is thus lowered by irradiation using an electron beam of small local energy spread, so that a higher information limit can be achieved. On the other hand, using a diaphragm in the image plane, for example the entrance diaphragm of the spectrometer, the inelastic electrons can be filtered out so that the background in the electron energy loss spectrum is suppressed.

The direction in which the object is focused is coincident with the dispersion direction. The spectrum is focused in the direction perpendicular to the dispersion direction. Thus, in one direction spectral information per pixel is formed, whereas in the direction perpendicular thereto the same information is present for other pixels. Consequently, the spectral information is measured per line per image.

The dimensions and energy spread of the electron beam spot determine the resolution. The resolution in the length direction of the spot is determined by the electron probe. The resolution in the width direction of the spot, i.e. the dispersion direction, is determined by the chromatic aberration of the objective lens. Electrons of deviating energy are thus liable to penetrate a region with local energy spread. One way of preventing this effect consists in arranging a correction element for correcting chromatic aberration in the principal plane of the objective lens. This element may be, for example a multi-pole element constructed as a combined magnetic and electrostatic quadrupole and should provide correction at least in the dispersion direction, because the image information of interest is situated in this direction.

In order to achieve adequate dispersion, the energy-dispersive member 20 is preferably arranged in the vicinity of the electron source 3, because the electrons still have a comparatively low acceleration potential at that area so that they can be comparatively readily influenced.

A Wien filter is preferably used for the dispersive member 20. A Wien fil 1,364,930. In such a filter the magnetic and the electric field cross one another at right angles and both fields are oriented perpendicularly to the propagation direction of the electrons. Exclusively electrons having a given velocity v, determined by the acceleration potential, will not be deflected, all other electrons being deflected at an angle which is dependent on their velocity.

Furthermore, a substantial advantage can be achieved by utilizing an electron source in the form of a field emission source. The intrinsic source diameter of a field emission source is substantially smaller than the source diameter of a conventional electron source. Consequently, for a comparable energy spread of both sources, after dispersion the spot of the field emission source will have a substantially greater length-to-width ratio.

I claim:

1. A method of selecting the spatial energy-spread within an electron beam which produces pixels forming an image of an object in an image plane, said method comprising: arranging an energy-dispersive member in the vicinity of an electron source which generates the electron beam; operating said member to widen the electron beam in a dispersion direction with a dispersivity which is greater than the diameter of the electron source; and selecting a local energy dispersion in the beam by selecting a number of pixels representing such a local energy dispersion in the image plane of the object.

2. A method as claimed in claim 1, characterized in that the selection of the number of pixels is performed by tilting the object.

3. A method as claimed in claim 1, in which the object is analysed in transmission, characterized in that an image processing procedure is applied in which the energy spread is used as a parameter.

4. A method as claimed in claim 1, in which the object is analysed in transmission, characterized in that an image part of specific local energy spread is selected by means of a selective member arranged in an image plane of the object.

5. A method of selecting the spatial energy-spread within an electron beam which produces an image of an object in an image plane, said method comprising: arranging an energy-dispersive member in the vicinity of an electron source which generates the electron beam; operating said member to widen the electron beam in a dispersion direction; and scanning the object with the widened electron beam in a direction in which the object is focussed and extending substantially perpendicularly to the dispersion direction, the magnitude of the scanning steps being determined by a desired resolution of said image of the object.

6. Electron beam apparatus for selecting the spatial energy spread within an electron beam for producing an image of an object in an image plane; comprising:
   an electron source for producing an electron beam;
   a specimen holder for supporting said object;
   an electron-optical system for focussing the electron beam on said object and producing pixels forming an image thereof in said image plane;
   an energy-dispersive member in the vicinity of the electron beam source for widening the electron beam in a dispersion direction with a dispersivity which is greater than the diameter of the electron beam source; and
   means for selecting a local energy dispersion within the beam by selecting a number of pixels representing such a local energy dispersion in the image plane of the object.

7. An electron beam apparatus as claimed in claim 6, characterized in that it further comprises an object tilting system.

8. An electron beam apparatus as claimed in claim 6 and which is

9. An electron beam apparatus as claimed in claim 6 and which is a transmission electron microscope, characterized in that it further comprises a diaphragm which is arranged in said imaging plane of the object.

10. An electron beam apparatus as claimed in claim 6, characterized in that the energy-dispersive member is arranged in a given position in a beam path between the electron source and a conjugate object plane, said position corresponding to an acceleration potential of less than 20 kV.

11. An electron beam apparatus as claimed in claim 6, characterized in that the energy-dispersive member is a Wien filter.

12. An electron beam apparatus as claimed in claim 6, characterized in that the electron source is a field emission source.

13. Apparatus for selecting the spatial-energy spread within an electron beam for producing an image of an object in an image plane; comprising:
- an electron source for producing an electron beam;
- a specimen holder for supporting said object;
- an energy-dispersive member in the vicinity of the electron beam source for widening the electron beam in a dispersion direction; and
- means for step-wise scanning the object with the widened electron beam in a direction in which the object is focussed and which extends substantially perpendicularly to the dispersion direction, the magnitude of the scanning steps being determined by a desired resolution of said image of the object.

14. An electron beam apparatus as claimed in claim 13, characterized in that the energy-dispersive member is arranged in a given position in a beam path between the electron source and a conjugate object plane, said position corresponding to an acceleration potential of less than 20 kV.

15. An electron beam apparatus as claimed in claim 13 characterized in that the energy-dispersive member is a Wien filter.

16. An electron beam apparatus as claimed in claim 13, characterized in that the electron source is a field emission source.

17. An electron beam apparatus as claimed in claim 13, characterized in that it further comprises an imaging analysis system for measuring a spectrum of said image in a direction extending substantially perpendicularly to a focusing direction of the object.

18. An electron beam apparatus as claimed in claim 17 further comprising a correction member which includes a multi-pole element for correction of chromatic aberration.

* * * * *